(12) United States Patent
Zoelfl et al.

(10) Patent No.: US 7,667,240 B2
(45) Date of Patent: Feb. 23, 2010

(54) RADIATION-EMITTING SEMICONDUCTOR CHIP AND METHOD FOR PRODUCING SUCH A SEMICONDUCTOR CHIP

(75) Inventors: Michael Zoelfl, Regensburg (DE); Wilhelm Stein, Lindau (DE); Ralph Wirth, Pettendorf-Addlersberg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/883,270

(22) Filed: Jun. 30, 2004

(65) Prior Publication Data

US 2005/0045978 A1    Mar. 3, 2005

(30) Foreign Application Priority Data

Jun. 30, 2003  (DE) .............................. 103 29 365
Jun. 30, 2003  (DE) .............................. 103 29 398

(51) Int. Cl.
*H01L 23/48* (2006.01)
*H01L 23/52* (2006.01)
*H01L 29/40* (2006.01)
*H01L 33/00* (2006.01)
H01L 21/00 (2006.01)
H01L 21/28 (2006.01)
H01L 21/3205 (2006.01)
H01L 21/44 (2006.01)

(52) U.S. Cl. ................. 257/99; 257/745; 257/E33.027; 257/E33.034; 257/E33.063; 257/E33.064; 257/E33.065; 257/E33.067; 257/E33.068; 438/29; 438/47; 438/604; 438/605; 438/685; 438/686

(58) Field of Classification Search ...................... None
See application file for complete search history.

(56) References Cited

U.S. PATENT DOCUMENTS 3,743,847 A    7/1973   Boland (Continued)

FOREIGN PATENT DOCUMENTS

DE              42 31 007 C2    3/1994

(Continued)

OTHER PUBLICATIONS

Jerzy Ruzyllo, Penn State University, "Organic Semiconductors", Semiconductor Note 11, Mar. 19, 2004.

*Primary Examiner*—Andy Huynh
*Assistant Examiner*—Hoang-Quan T Ho
(74) *Attorney, Agent, or Firm*—Cohen Pontani Lieberman & Pavane LLP

(57) ABSTRACT

A radiation-emitting semiconductor chip having an absorbent brightness setting layer between a connection region and a current injection region and/or, as seen from the connection region, outside the current injection region on a front-side radiation coupling-out area of the semiconductor layer sequence. The brightness setting layer absorbs in a targeted manner part of the radiation generated in the semiconductor layer sequence. In another embodiment, a partly insulating brightness setting layer is arranged between the connection region and the active layer. Here, the brightness setting layer includes at least one electrically insulating current blocking region and at least one electrically conductive current passage region via which the connection region is electrically conductively connected to the semiconductor layer sequence such that, during operation of the semiconductor chip, part of the electromagnetic radiation generated in the chip is generated below the connection region and is absorbed by the connection region.

28 Claims, 5 Drawing Sheets

U.S. PATENT DOCUMENTS

| | | | |
|---|---|---|---|
| 4,864,370 A | | 9/1989 | Gaw et al. |
| 4,988,579 A | * | 1/1991 | Tomomura et al. ............ 257/78 |
| 5,399,504 A | | 3/1995 | Ohsawa |
| 5,459,106 A | | 10/1995 | Yamada et al. |
| 5,745,515 A | | 4/1998 | Marta et al. |
| 5,838,707 A | * | 11/1998 | Ramdani et al. ......... 372/50.11 |
| 5,912,913 A | | 6/1999 | Kondow et al. |
| 5,962,971 A | | 10/1999 | Chen |
| 6,020,602 A | * | 2/2000 | Sugawara et al. ............ 257/103 |
| 6,037,718 A | | 3/2000 | Nagami |
| 6,072,818 A | * | 6/2000 | Hayakawa ............ 372/46.014 |
| 6,160,834 A | | 12/2000 | Scott |
| 6,221,684 B1 | * | 4/2001 | Sugawara et al. ............. 438/47 |
| 6,420,732 B1 | * | 7/2002 | Kung et al. ................... 257/79 |
| 6,438,150 B1 | | 8/2002 | Yoo |
| 6,618,409 B1 | | 9/2003 | Hu et al. |
| 6,690,028 B2 | | 2/2004 | Wakimoto et al. |
| 6,744,077 B2 | | 6/2004 | Trottier et al. |
| 6,841,802 B2 | | 1/2005 | Yoo |
| 7,026,756 B2 | | 4/2006 | Shimizu et al. |
| 7,103,081 B2 | | 9/2006 | Nomaguchi |
| 2001/0000622 A1 | | 5/2001 | Reeh et al. |
| 2002/0088980 A1 | | 7/2002 | Wipiejewski |
| 2002/0113243 A1 | | 8/2002 | Kikawa et al. |
| 2003/0006422 A1 | * | 1/2003 | Miki et al. ................... 257/99 |
| 2003/0059972 A1 | | 3/2003 | Ikeda et al. |
| 2003/0062530 A1 | * | 4/2003 | Okazaki et al. ............... 257/79 |
| 2003/0103543 A1 | | 6/2003 | Moser et al. |
| 2003/0108076 A1 | | 6/2003 | Yoon et al. |
| 2003/0122136 A1 | | 7/2003 | Oshima |
| 2003/0151056 A1 | | 8/2003 | Yamazaki |
| 2003/0197179 A1 | | 10/2003 | Yamazaki et al. |
| 2003/0227582 A1 | | 12/2003 | Yu et al. |
| 2004/0119083 A1 | | 6/2004 | Su et al. |
| 2004/0151221 A1 | | 8/2004 | Yamamoto et al. |
| 2004/0161674 A1 | | 8/2004 | Nozute |
| 2004/0169184 A1 | * | 9/2004 | Udagawa et al. ............... 257/86 |
| 2004/0238837 A1 | | 12/2004 | Jacob et al. |
| 2005/0008056 A1 | * | 1/2005 | Albrecht et al. ............... 372/50 |
| 2006/0220518 A1 | | 10/2006 | Greiner |

FOREIGN PATENT DOCUMENTS

| | | |
|---|---|---|
| DE | 43 38 187 A1 | 5/1995 |
| DE | 694 11 836 T2 | 3/1999 |
| DE | 101 12 542 A1 | 10/2002 |
| EP | 0 562 173 A1 | 9/1993 |
| EP | 0 563 991 A2 | 10/1993 |
| EP | 1 278 249 A1 | 3/2001 |
| WO | WO 02/075819 | 9/2002 |
| WO | WO 2004/044999 A3 | 5/2004 |

* cited by examiner

RADIATION-EMITTING SEMICONDUCTOR CHIP AND METHOD FOR PRODUCING SUCH A SEMICONDUCTOR CHIP

RELATED APPLICATIONS

This patent application claims the priorities of the German Patent Applications DE 103 29 398.1 of 30 Jun. 2003 and DE 103 29 365.5 of 30 Jun. 2003, the entire disclosure content of which is hereby explicitly incorporated by reference in the present patent application.

FIELD OF THE INVENTION

The invention relates to a radiation-emitting semiconductor chip having a semiconductor layer sequence comprising at least one active layer that generates an electromagnetic radiation, and having an electrical contact layer comprising a connection region and a current injection region, which is arranged outside the connection region and is electrically connected thereto. It furthermore relates to a method for producing such a semiconductor chip.

BACKGROUND OF THE INVENTION

The semiconductor layers of semiconductor chips, for example the radiation-generating layer structures of radiation-emitting and of radiation-receiving semiconductor chips, can be defined by a multiplicity of different epitaxy methods, such as metal organic vapor phase epitaxy (MOVPE), molecular beam epitaxy (MBE), liquid phase epitaxy (LPE), etc. As an alternative or in a supplementary manner, such layer structures may at least partly be defined by indiffusion of dopants.

Both epitaxy processes and doping processes are subject to certain manufacturing fluctuations. In the case of light-emitting semiconductor chips, manufacturing fluctuations often lead to fluctuations in the brightness of semiconductor chips that are nominally of identical type, during operation. Both the wafers that are produced in different epitaxy process runs and the various wafers that are produced simultaneously in one process run are subject to manufacturing fluctuations, the fluctuations within the wafers produced in one process run being smaller.

SUMMARY OF THE INVENTION

One object of the present invention is to provide a semiconductor chip structure having radiation emission that can be set to a desired range during the production of said semiconductor chip structure. It is furthermore an object to provide a method for producing such a semiconductor chip.

These and other objects are attained in accordance with one aspect of the invention directed to a radiation-emitting semiconductor chip having a semiconductor layer sequence comprising at least one active layer that generates an electromagnetic radiation. In addition, an electrical contact layer includes a connection region and a current injection region, which is arranged at a distance beside the connection region and electrically coupled thereto. An absorbent brightness setting layer is applied between the connection region and the current injection region and/or, as seen from the connection region, outside the current injection region on a front-side radiation coupling-out area of the semiconductor layer sequence. The brightness setting layer absorbs in a targeted manner part of a radiation generated in the semiconductor layer sequence.

Another aspect of the present invention is directed to a radiation-emitting semiconductor chip having a semiconductor layer sequence comprising at least one active layer that generates an electromagnetic radiation. An electrical contact layer includes a connection region and a current injection region, which is arranged at a distance beside the connection region and is electrically connected thereto. A partly insulating brightness setting layer is arranged between the connection region and the active layer. The brightness setting layer includes at least one electrically insulating current blocking region and at least one electrically conductive current passage region via which the connection region is electrically conductively connected to the semiconductor layer sequence, in such a way that, during operation of the semiconductor chip, part of the electromagnetic radiation generated in the chip is generated below the connection region and is absorbed by the latter.

A further aspect of the present invention is directed to a method for setting the brightness of radiation-emitting semiconductor chips, wherein during the method, after a measurement of radiation emission properties of a radiation-emitting semiconductor layer sequence of a wafer, a brightness setting layer is applied to a radiation coupling-out side of the wafer.

In preferred refinements of the invention, the absorbent brightness setting layer includes titanium and/or platinum. With titanium, a brightness reduction that can be set uniformly and well can be achieved even in thin layers. Depending on the wavelength range within which lies the semiconductor chip's radiation that is to be absorbed, it is also possible to use other materials, in particular metals or alloys, for the absorbent brightness setting layer. In particular, gold, AuGe, AuBe, AuZn and TiW(N) are advantageous, by way of example. The absorbent brightness setting layer may be applied by established methods in semiconductor technology, such as PVD or CVD methods, for example by means of sputtering or vapor deposition.

In a further preferred refinement of the invention, the thickness of the absorbent brightness setting layer lies between 2 nm and 30 nm, preferably between 2 and 10 nm. It is chosen such that radiation is absorbed by the brightness setting layer in a proportion such that the brightness of the semiconductor chip lies within a predetermined desired range.

In a further refinement of the invention, the current injection region is arranged outside or at a distance beside the connection region.

In a further refinement of the invention, an absorbent brightness setting layer is applied between the connection region and the current injection region and/or, as seen from the connection region, outside the current injection region on a front-side radiation coupling-out area of the semiconductor layer sequence, the brightness setting layer absorbing in a targeted manner part of a radiation generated in the semiconductor layer sequence.

In the present case, the indication that a, for instance, partly insulating or absorbent brightness setting layer is arranged between connection region and active layer means that, as seen from the active layer, the brightness setting layer and the connection region at least partly overlap. By way of example, they overlap in such a way that the connection region completely covers the brightness setting layer.

One or a plurality of brightness setting layers, for instance an absorbent and/or partly insulating brightness setting layer, make it possible, in each case inherently alone or in combination, even from wafers with different brightnesses, such as may arise for example on account of fluctuations in the epitaxy and/or doping process or on account of fluctuations between different process runs, to produce semiconductor chips having a brightness that lies comparatively reliably within a predetermined desired brightness range. For this purpose, by way of example, thickness, area and radiation transmissivity of an absorbent brightness setting layer are set in such a way that radiation which would lead to an excessively high brightness of the chip is absorbed by the absorbent brightness setting layer.

In an expedient refinement of the invention, a passivation layer is applied at least partly on the, for instance, absorbent or partly insulating brightness setting layer. The passivation layer protects the brightness setting layer, for example, from oxidation and mechanical damage. For example, the passivation layer is a silicon nitride layer. Preferably, a passivation layer is applied at least partly on an absorbent brightness setting layer.

Semiconductor chips according to an aspect of the invention may preferably be produced such that, despite fluctuations in the epitaxy and/or doping process, brightnesses which lie within a desired brightness range are achieved during operation of the semiconductor chips.

Furthermore, a semiconductor chip structure according to the invention advantageously makes it possible, with semiconductor layer sequences that are grown epitaxially in the same way, to produce semiconductor chips with, by way of example, brightnesses that are different in a targeted manner depending on the application. Consequently, it is advantageous that it is no longer totally necessary to use different epitaxy processes for producing semiconductor chips with different brightnesses.

Consequently, an epitaxy installation can advantageously be operated with uniform process sequences to an increased extent, which contributes overall to stabilizing epitaxy processes.

Using chip structures and methods according to an aspect of the present invention, it is particularly expedient, in order to obtain uniform chip brightness batches in one or a plurality of process runs, to manufacture semiconductor layer sequences with a brightness that is greater than the desired brightness range of the finished chips, and to set, that is to say to darken, the chip brightness by means of a brightness setting layer, such as an absorbent and/or partly insulating brightness setting layer, according to an aspect of the invention.

The connection region and the semiconductor layer sequence are preferably electrically conductively connected to one another via the current passage region in such a way that, during operation of the semiconductor chip, current is injected into the active layer below the connection region. In contrast to the aim of avoiding shading of light generated below the connection region by preventing current injection with the aid of an electrically insulating barrier layer between connection region and active zone, current is thus injected into the active layer below the connection region in a targeted manner.

The size and the position of the current passage region can be set in such a way that such a proportion of an operating current of the semiconductor chip is injected below the connection region, and consequently leads to a corresponding absorption of radiation generated in the semiconductor chip in the connection region, that a radiation emission of the semiconductor chip lies within a predetermined desired range.

Electromagnetic radiation is generated in a targeted manner in the semiconductor chip by means of the current passage region, which electromagnetic radiation is not coupled out of the semiconductor chip, but rather is absorbed in the contact layer. By way of this route, it is possible, for example, in the case of semiconductor chips that have a semiconductor layer sequence with a brightness lying above a desired range that is wanted for a fixedly predetermined operating current, to reduce the brightness of the chip by part of the fixedly predetermined operating current being injected beneath the connection region and at least part of the radiation that is generated there being absorbed by the connection region. By setting the size and position of the current passage region, it is possible to set the proportion of the radiation which is generated in the semiconductor chip and is not coupled out of the latter. In the case of a semiconductor layer sequence having comparatively low brightness, by way of example, in order to achieve the same brightness for the chips as for chips having a semiconductor layer sequence that is "brighter" for the same operating current, the current passage region is made smaller in comparison with the chip having a "brighter" semiconductor layer sequence.

As a precaution, it should be pointed out that in the present case "brightness" does not relate exclusively to semiconductor layer sequences that emit visible light, but also to semiconductor layer sequences that emit infrared radiation and/or to semiconductor layer sequences that emit UV radiation. Consequently, the invention is not restricted to semiconductor chips that emit visible light, but rather also relates to IR-emitting semiconductor chips and also to UV-emitting semiconductor chips.

In a further refinement, the current blocking region, which is particularly preferably formed as a current blocking layer, contains silicon nitride. The current blocking region may be applied by various methods, for example by means of sputtering, vapor deposition or CVD methods.

The current blocking region expediently comprises an electrically insulating layer with a cut-out applied on the semiconductor layer sequence, and the connection region is applied in the cut-out on the semiconductor layer sequence.

The cut-out in the current blocking region may be introduced, for example, after the application of an electrical insulation layer by means of a conventional method such as etching or resputtering. The cut-out may also be introduced as early as during the application of the insulation layer with the aid of lithographic methods. By means of conventional application of the contact layer, for example, the contact layer also fills the cut-out and is thus in physical contact with the semiconductor layer sequence. If, in the region of the cut-out to be introduced, a brightness setting layer, for instance an absorbent brightness setting layer, is already situated below the insulation layer, then this may also be removed, if appropriate, from the semiconductor layer sequence in the region of the cut-out.

In a further refinement of the invention, the current blocking region is an electrically insulating zone of the semiconductor layer sequence arranged between the active layer and the connection region. In this case, the current blocking region may be a proton-implanted zone of the semiconductor layer sequence and the current passage region may be a zone of the semiconductor layer sequence having a lower proton concentration in comparison therewith.

A transverse conductivity in the semiconductor layer sequence can be so low that, during operation of the semiconductor chip current which is injected into the semiconductor layer sequence below the connection region essentially remains limited to the overlap region of connection region and semiconductor layer sequence.

This makes a substantial contribution to the fact that generation of radiation below the connection region by current injection via the connection region results in the desired reduction of brightness of the semiconductor chips.

The chip structure according to an aspect of the invention is suitable for semiconductor chips having a semiconductor layer sequence based on InGaAlP.

In the present case, the group of radiation-emitting and/or radiation-detecting chips based on InGaAlP includes, in particular, such chips in which the epitaxially produced semiconductor layer sequence, which generally has a layer sequence made of different individual layers, contains at least one individual layer having a material from the III-V compound semiconductor material system $In_xAl_yGa_{1-x-y}P$ where $0 \leq x \leq 1$, $0 \leq y \leq 1$ and $x+y \leq 1$. The semiconductor layer sequence may have, for example, a conventional pn junction, a double heterostructure, a single quantum well structure (SQW structure) or a multiple quantum well structure (MQW structure). Such structures are known to the person skilled in the art and are therefore not explained in any further detail at this juncture. In principle, a semiconductor chip according to an aspect of the invention may be based on any semiconductor material which can be used for radiation-emitting and/or radiation-receiving chips.

In a further refinement of the invention, the insulation layer is arranged at least partly between current injection region and semiconductor layer sequence. This variant makes it possible to reduce that proportion of the operating current which is injected outside the connection region.

In a variation of invention, a single layer may partly or entirely have the functions of the passivation layer, of the current blocking region and of the insulation layer.

According to an aspect of the invention, in the case of a semiconductor layer sequence having a radiation power lying above or below a desired value, the size and the position of the current passage region and of the current blocking region may be chosen in such a way that such a proportion of an operating current of the semiconductor chip is injected below the connection region, and consequently leads to a corresponding absorption of radiation generated in the semiconductor chip in the connection region, that a radiation emission of the semiconductor chip lies within a predetermined desired range.

Instead of being realized as a partly insulating brightness setting layer with a current blocking region and a current passage region, a brightness setting layer may alternatively be realized with the aid of a continuous electrically conductive layer which is arranged between connection region and active layer and whose electrical resistance is set depending on the brightness of the semiconductor layer sequence. In this case, partly insulating regions of a brightness setting layer may also be regarded as regions of the above brightness setting layer having an increased electrical resistance in comparison with other regions of the above brightness setting layer.

An additional or alternative possibility for "masking out" part of a radiation generated in excess in the semiconductor chip for the purpose of further brightness setting by shading consists in widening the width of connecting webs between the connection region and the current injection region. This by itself alone, if appropriate, represents a possibility for achieving sufficient brightness control, but may also be used in addition to the technical means outlined above.

In a method according to an aspect of the invention for setting the brightness of radiation-emitting semiconductor chips, during the method, after a measurement of radiation emission properties of a radiation-emitting semiconductor layer sequence of a wafer, a brightness setting layer is applied to a radiation coupling-out side of the wafer.

The brightness setting layer can be formed as an absorbent brightness setting layer or a partly insulating brightness setting layer.

The brightness setting layer can be formed as an absorbent brightness setting layer and a partly insulating brightness setting layer is additionally applied to a radiation coupling-out side of the wafer.

In a first embodiment of a method for producing a semiconductor chip according to an aspect of the invention, after the production or during the production of the semiconductor layer sequence with an active layer on a substrate, the brightness of the semiconductor layer sequence is measured. Afterwards, on the basis of the measurement result, a suitable geometry of the absorbent brightness setting layer and, if necessary, of a further, for instance partly insulating, brightness setting layer is determined and this (these) brightness setting layer(s) is(are) formed correspondingly on the semiconductor layer sequence. This is followed by the formation of the contact layer with connection region and, if appropriate, current injection region. For an absorbent brightness setting layer, a suitable thickness is preferably determined as well.

In a second embodiment of a method for producing a semiconductor chip according to an aspect of the invention, after the production or during the production of the semiconductor layer sequence with an active layer on a substrate, the brightness of the semiconductor layer sequence is measured. Afterwards, on the basis of the measurement result, a suitable geometry of the partly insulating brightness setting layer is determined and the partly insulating brightness setting layer is formed correspondingly on the semiconductor layer sequence. This is followed by the formation of the contact layer with connection region and current injection region.

In a further refinement expedient refinement of the invention, after the measurement of the semiconductor layer sequence and the formation of an electrically insulating layer as the current blocking region with a cut-out for the current passage region, the contact layer is applied and the cut-out is at least partly filled with contact layer material in the process.

In a further refinement of the invention, after the measurement of the semiconductor layer sequence, the current passage region and the current blocking region are produced by different dopings of a region of the semiconductor layer sequence near the surface.

The form and size of the contact layer can always remain unchanged independently of the locations at which the current blocking region and the current passage region are situated. Therefore, it is advantageous that the structure of the semiconductor chips in plan view may remain essentially unchanged, which has a particularly advantageous effect for automatic image recognition in automatic manufacturing machines, such as die bonders, and for measuring equipment.

A key part in one aspect of the present invention involves setting the brightness of radiation-emitting semiconductor chips by a procedure in which, in an advantageous manner during the production of the semiconductor chips, after the measurement of radiation emission properties of a radiation-emitting semiconductor layer sequence of a wafer, one or a plurality of brightness setting layers, for instance an absorbent and/or partly insulating brightness setting layer, is (are) applied to a radiation coupling-out side of the wafer.

BRIEF DESCRIPTION OF THE DRAWINGS

2b shows a diagrammatic illustration of a second variant of a section through the first exemplary embodiment of the invention.

DETAILED DESCRIPTION OF THE PRESENTLY PREFERRED EMBODIMENTS

In the various exemplary embodiments of the invention, identical or identically acting component parts are in each case designated identically and provided with the same reference symbols. The layer thicknesses illustrated are not to be regarded as true to scale. Rather, the illustration shows them with exaggerated thickness and not with the actual thickness ratios relative to one another, in order to afford a better understanding.

Figure 1:
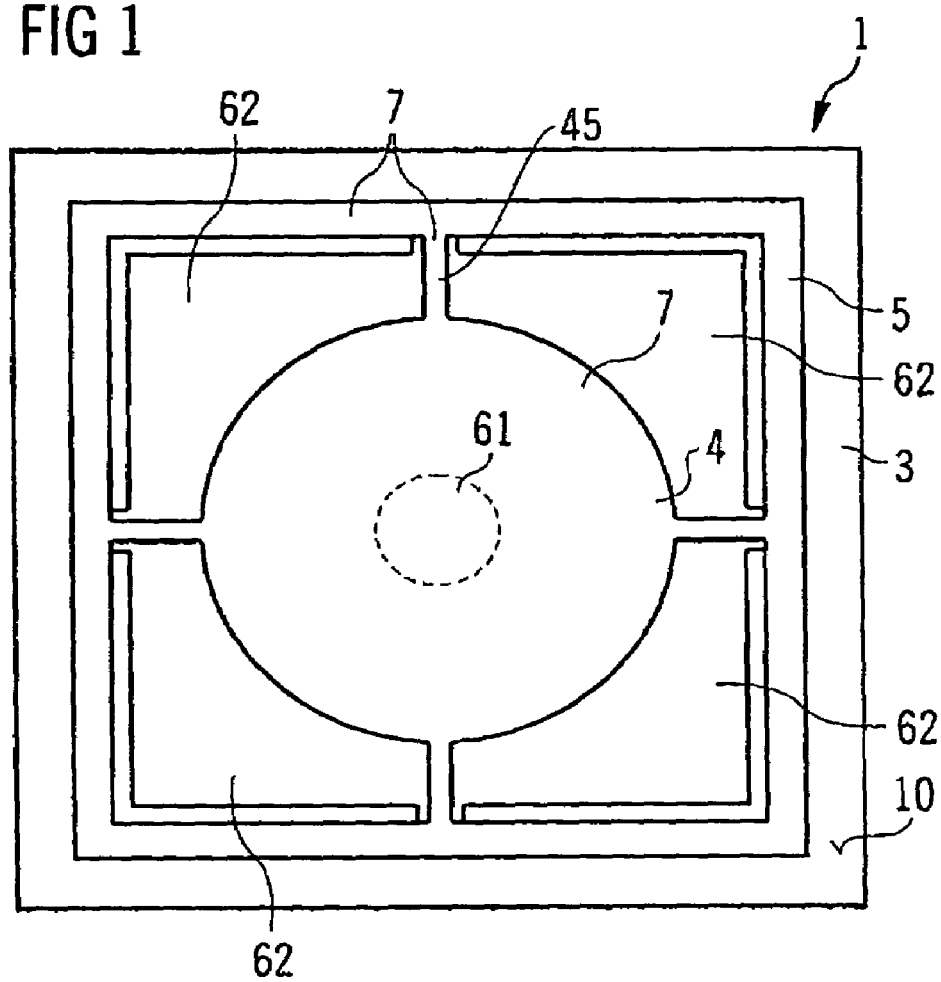
FIG. 1 shows a diagrammatic illustration of a plan view of a semiconductor chip in accordance with a first exemplary embodiment of the invention.
Figure 2A:
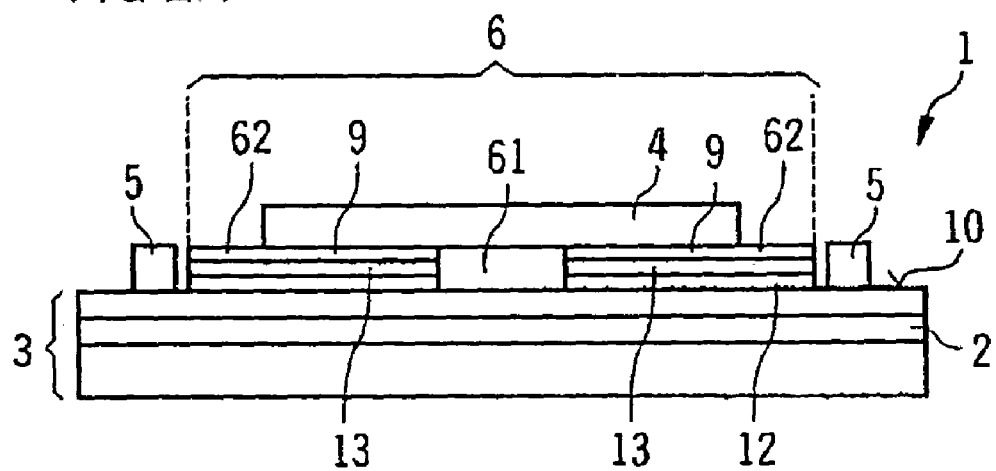
FIG. 2a shows a diagrammatic illustration of a first variant of a section through the first exemplary embodiment and FIG.
Figure 2B:
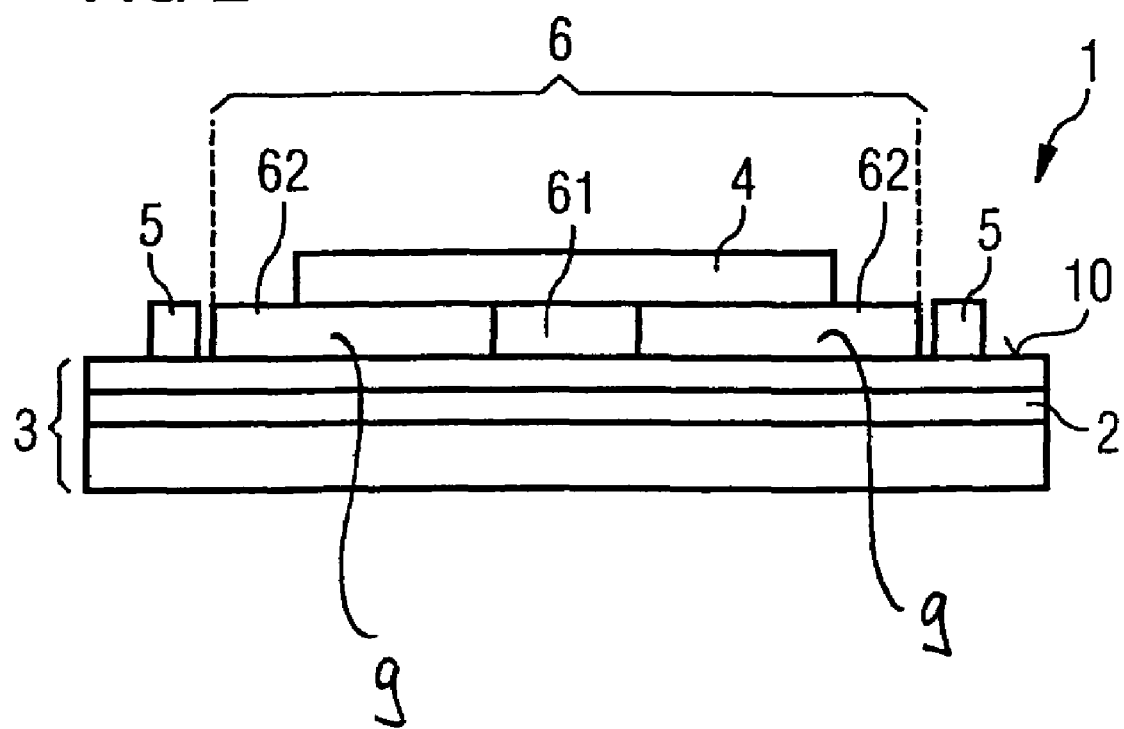
Figure 3A:
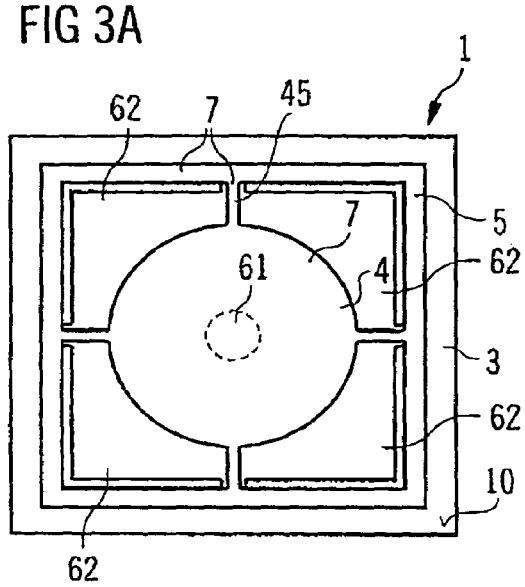
FIGS. 3a-3d show diagrammatic illustrations of plan views of four variants of the first exemplary embodiment of the invention.
Figure 3B:
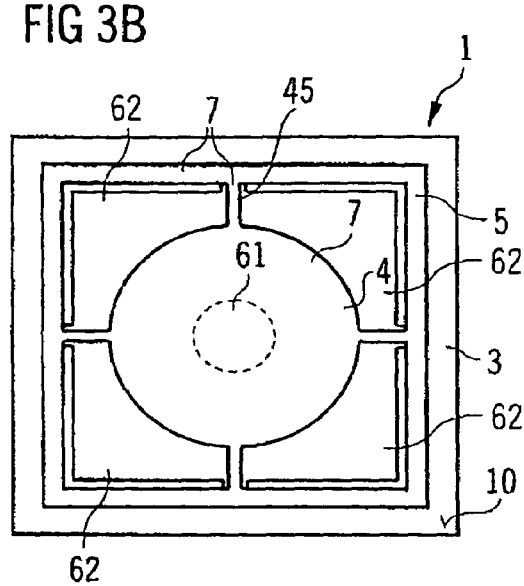
Figure 3C:
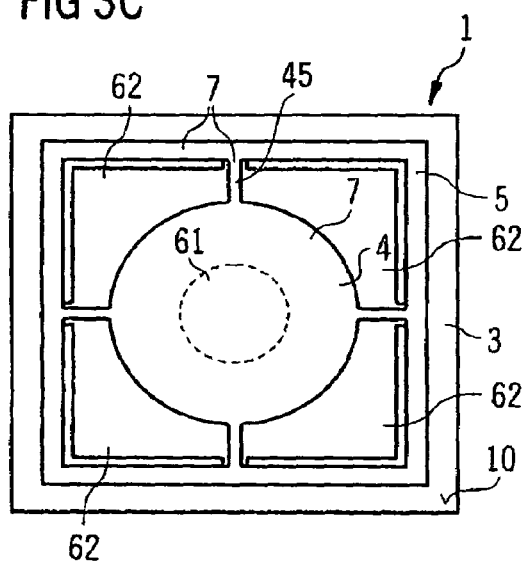
Figure 3D:
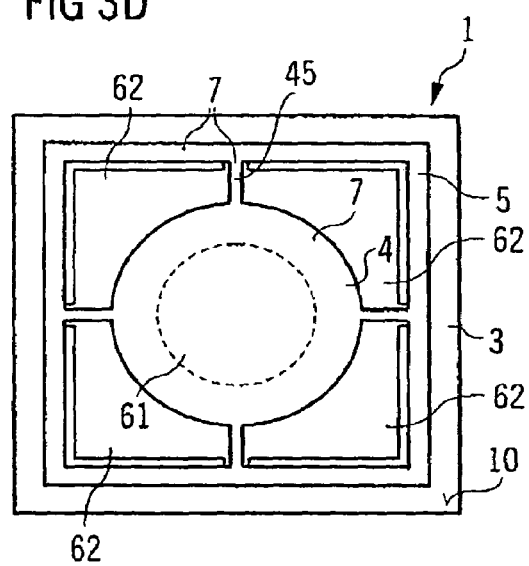

The exemplary embodiment as illustrated on the basis of two variants in FIGS. 1 and 2a, and in FIGS. 1 and 2b, involves a radiation-emitting semiconductor chip 1 having an InGaAlP-based semiconductor layer sequence 3 having an active layer 2 that generates electromagnetic radiation. The active layer 2 may comprise an individual semiconductor layer or have a plurality of semiconductor layers which form a multiple quantum well structure for example.

A contact layer 7 with a connection region 4 and a current injection region 5 is applied on the semiconductor layer sequence 3. The connection region 4 is a circular bonding pad arranged in the centre of a square frame, representing the current injection region 5. Both the connection region 4 and the current injection region 5 may have other geometries, as required.

In accordance with the variant in FIG. 2a, an absorbent brightness setting layer 12 is arranged on the semiconductor layer sequence 3, the brightness of the semiconductor chip 1 being set by way of the radiation transmissivity of the brightness setting layer during the process for producing the semiconductor chip. In this exemplary embodiment, the absorbent brightness setting layer 12 has a thickness of 6 nm and essentially contains titanium or is a pure titanium layer. During operation of the semiconductor chip, part of the radiation which is generated in the active layer is absorbed in the titanium layer. This reduces the brightness of the semiconductor chip 1, which would otherwise lie above a desired brightness on account of the epitaxy process and the doping process. The layer thickness of the titanium layer is to be adapted depending on what brightness reduction is sought.

Instead of Ti, it is also possible to use platinum, gold, AuGe, AuZn, AuBe, TiW(N) or a suitable metal or a suitable metal alloy as material for the absorbent brightness setting layer. Depending on the wavelength range within which the semiconductor chip's radiation that is to be absorbed lies, it is also possible to use other materials for the absorbent brightness setting layer. This also holds true, in particular, in the wavelength ranges which lie outside visible radiation.

A passivation layer 13, containing silicon nitride, for example, may additionally be arranged on the absorbent brightness setting layer and, if necessary, also on the radiation coupling-out area 10. However, the passivation layer 13 may also have other materials, such as passivation materials that are conventionally used in semiconductor technology, for example.

In an expedient method for producing such semiconductor chips, after the epitaxial growth of the semiconductor layer sequence on a wafer, an absorbent brightness setting layer, for example in the form of a semitransparent metal layer made of titanium, is applied to the semiconductor layer sequence. Afterwards, a passivation layer, for example in the form of a silicon nitride covering, is applied to the layer, and is opened at the contact points for the current injection region(s) including the absorbent brightness setting layer through to the semiconductor layer sequence. This is followed by deposition of the electrical contact layer (for example AuZn, TiW(N), Al) and customary further processing of the wafer.

What is furthermore achieved by the fact that the electrically insulating passivation layer 13 lies below the connection region 4 in this exemplary embodiment is that the current is injected into the active layer 2 principally in the current injection region 5 in the form of a frame, for example. The passivation layer 13 prevents large quantities of radiation which for the most part would be absorbed by the connection region 4 from being generated below the radiation-opaque connection region 4 during operation. However, the passivation layer 13 may also be arranged below the connection region in other geometries, such as, for example, in annular fashion, in circular fashion or in other advantageous geometries. It may extend beyond the connection region over the semiconductor chip, primarily in order to protect the absorbent brightness setting layer and/or to prevent current injection in certain regions.

In an advantageous development, a partly insulating brightness setting layer 6 is arranged between the connection region 4 and the semiconductor layer sequence 3, the brightness setting layer being composed of a current passage region 61 positioned centrally below the connection region and a current blocking region 62 enclosing the current passage region 61 like a ring.

A partly insulating brightness setting layer 6 having a current passage region 61 and a current blocking region 62 may, if appropriate, be provided in addition to an absorbent brightness setting layer 12 and a passivation layer 13, as shown diagrammatically in the sectional variant in FIG. 2a as a cross section taken through the structure of FIG. 1. Preferably, an individual layer, for instance an insulation layer 9, is simultaneously formed as current blocking region 62 and passivation layer 13, so that, if appropriate, the passivation layer 13 can be dispensed with.

For a desired brightness reduction, it is also possible to dispense with an absorbent brightness setting layer 12. Such a structure is shown in FIG. 2b on the basis of a second variant of a sectional view through the structure illustrated in plan view in FIG. 1. The structure in FIG. 2b essentially corresponds to the structure of the variant from FIG. 2a except for the absent passivation layer 13 and the absent absorbent brightness setting layer 12.

The current blocking region 62 may be a silicon nitride layer, for example. However, the current blocking region 62 may also be produced from other electrically insulating materials that are conventionally used in semiconductor technology. During operation of the semiconductor chip, current is injected exclusively via the current injection region 5 and through the current passage region 61 into the semiconductor layer sequence 3 and consequently into the active layer 2. The electrically insulating insulation layer 9 is preferably formed as a current blocking region and particularly preferably has a cut-out.

The current injection via the current passage region 61 of the brightness setting layer 6 has the effect that part of a predetermined operating current generates radiation in the active layer 2, a substantial part of which radiation is not coupled out of the semiconductor chip, but rather is absorbed by the connection region. The quantity of radiation which is not coupled out can be set by way of the size of the current passage region 61. To a corresponding extent, there is a decrease, with the operating current kept constant, in the current injected via the current injection region 5 and, accordingly, in the radiation which is generated due to the current in the active layer 2 and is coupled out of the semiconductor chip.

If required for sufficient brightness reduction, the current blocking region may also be arranged at least partly between the current injection region 5 and the active layer 2. By way of example, a large part or all of the operating current may then be injected into the active layer 2 via the connection region 4.

The form and size of the contact layer 7 may remain unchanged independently of the locations at which the current blocking region 62 is situated. Therefore, the semiconductor chips 1 remain essentially identical in their plan view, which, as already set forth above, is advantageous for automatic image recognition in various automatic manufacturing machines, such as die bonders, and for measuring devices.

The four variants of semiconductor chips in accordance with FIGS. 3a to 3d have current passage openings of different sizes in comparison with the exemplary embodiment described previously in conjunction with FIGS. 1 and 2a, and FIGS. 1 and 2b. The size of the current passage region 61 respectively increases from the variant in accordance with FIG. 3a to the variant in accordance with FIG. 3d. If the semiconductor layer sequences of all four variants have identical radiation properties and if all four variants are operated with the same operating current, then the brightness of the semiconductor chips in each case decreases from the variant in accordance with FIG. 3a to the variant in accordance with FIG. 3d, because an ever greater proportion of the operating current is injected below the connection region 4 from FIG. 3a to 3d. A current expansion may occur beneath the current passage region 61 on account of the transverse conductivity of the semiconductor layer sequence 3. Therefore, the current injected below the connection region 4 may also partly contribute to the coupled-out radiation. However, the further away the location of current injection via the current passage region is from that region of the radiation coupling-out area 10 which is not covered by the connection region 4, the less the radiation generated below the connection region 4 can contribute to the radiation emission. Accordingly, in the current passage regions 61 shown in FIGS. 3a to 3d, in the order from FIG. 3a to FIG. 3d, on the one hand more current is injected owing to the increasing areas of the current passage regions and, on the other hand, a greater proportion of the radiation generated below the connection region 4 is coupled out owing to the increasing proximity to the radiation coupling-out area 10. Which of these two opposite effects predominates essentially depends on the current expansion properties of the semiconductor layer sequence 3. For an effective brightness reduction with the aid of the current passage region 61, it is expedient that even in the case of the variant in accordance with FIG. 3d, only a little of the current injected below the connection region 4 can generate radiation which is coupled out of the chip and can thus contribute to the brightness of the semiconductor chip 1. However, there may be other reasons which require a better current expansion, such as, for example, reduction of the current density below the current injection region 5. The partly insulating brightness setting layer must be adapted depending on the specific requirement. In particular, one and the same layer may entirely or partly have the functions of the passivation layer 13, of the current blocking region 62 and of the insulation layer 9.

Figure 4A:
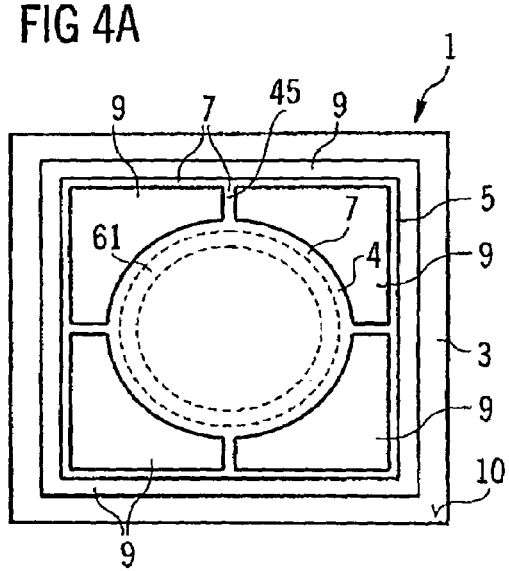
FIGS. 4a-4d show diagrammatic illustrations of plan views of four further variants of the first exemplary embodiment of the invention.
Figure 4B:
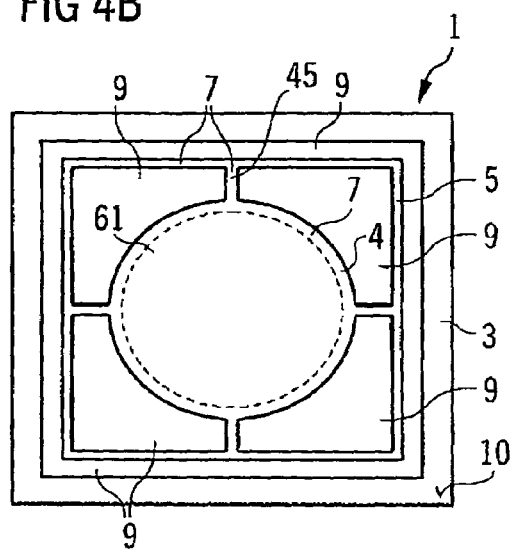
Figure 4C:
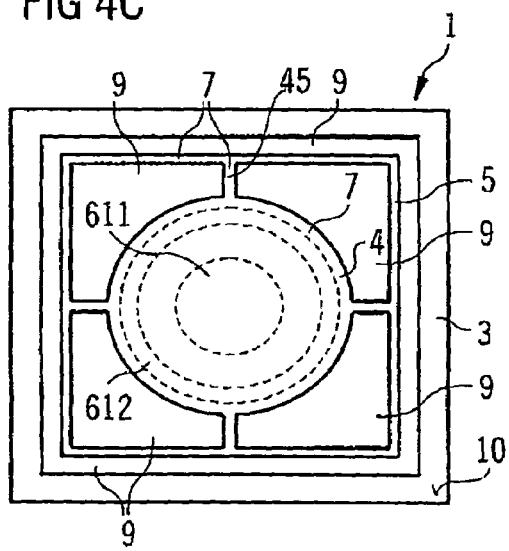
Figure 4D:
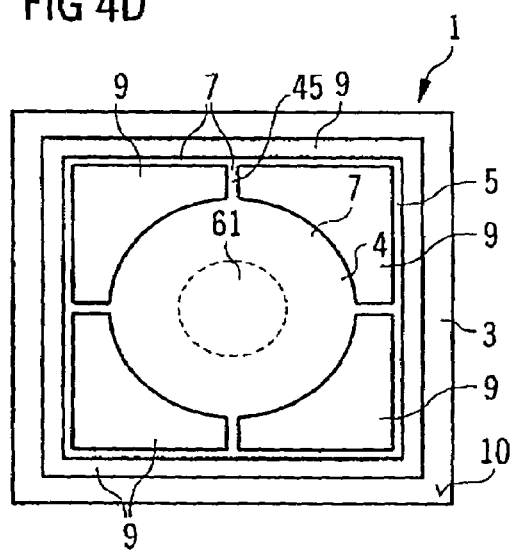

In the case of the four variants of semiconductor chips in accordance with FIGS. 4a to 4d, the current blocking region 62 (shown in the drawings, for example, as being embodied by insulating layer 9) of the partly insulating brightness setting layer 6 is drawn right under the current injection region 5, so that the current injection into the semiconductor layer sequence 3 can be exclusively effected via the current passage region 61 of the partly insulating brightness setting layer 6 below the connection region 4 of the contact layer 7. The brightness of a semiconductor chip 1 in accordance with FIG. 4b essentially corresponds to that of a semiconductor chip 1 which has only one bonding pad directly on the semiconductor layer sequence. In the case of the semiconductor chip in accordance with FIG. 4a, the current passage region 61 is formed in annular fashion and is arranged beneath the connection region 4. Given an identical semiconductor layer sequence, such a semiconductor chip 1 is brighter than a semiconductor chip in accordance with the variant of FIG. 4b, since more current is injected at the edge of the connection region 4 and consequently near the radiation coupling-out area 10 of the semiconductor chip. The variant in accordance with FIG. 4c has a central first current passage region 611 below the connection region 4 and a second current passage region 612 running around the said first current passage region like a ring. The variant in accordance with FIG. 4d has only a relatively small central current passage region 61 below the connection region 4. Assuming that the semiconductor layer sequences are identical to those in the previous variants, the brightnesses of the semiconductor chips in accordance with FIGS. 4c and 4d are lower than the brightnesses of the semiconductor chips in accordance with FIGS. 4a and 4b, since the current injection into the semiconductor layer sequence and thus the radiation generation in the semiconductor layer sequence are for the most part effected comparatively far away from the radiation coupling-out area 10.

Figure 5:
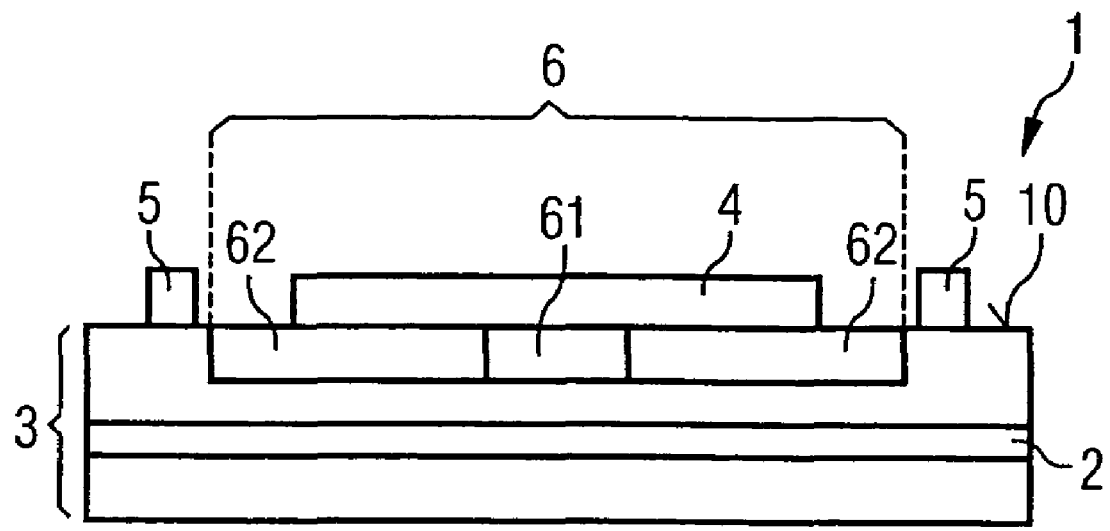
FIG. 5 shows a diagrammatic illustration of a section through the second exemplary embodiment of the invention.

In a second exemplary embodiment as illustrated in FIG. 5, as an alternative to the above-described exemplary embodiment and the variants thereof, the current blocking region 62 is an electrically insulating zone of the semiconductor layer sequence arranged between active layer 2 and connection region 4. In this case, expediently, the current blocking region may be a proton-implanted zone of the semiconductor layer sequence and the current passage region may be a zone of the semiconductor layer sequence having a lower proton concentration in comparison therewith. The basic two-dimensional geometry of the brightness setting layer 6 in plan view may be chosen in accordance with the above-described exemplary embodiment and the variants thereof.

Figure 6:
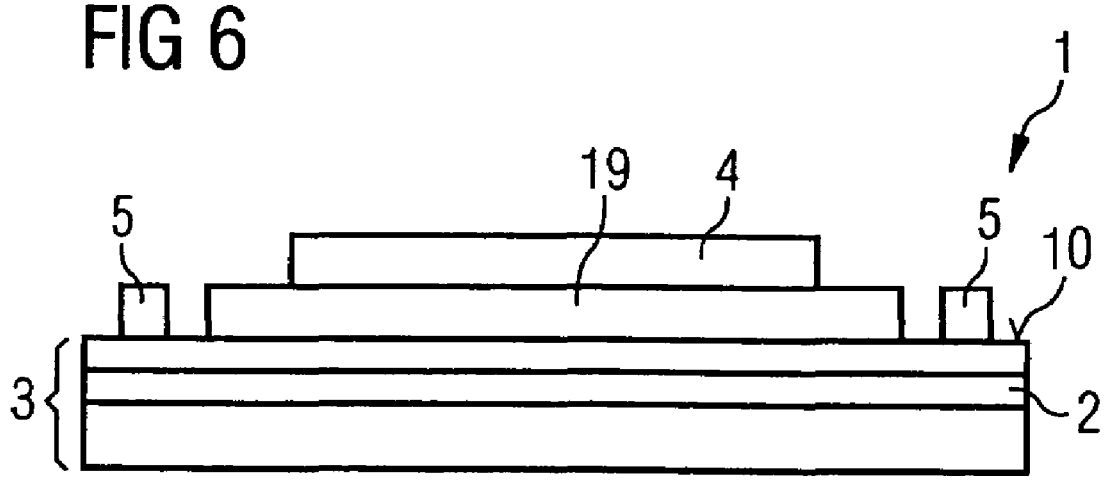
FIG. 6 shows a diagrammatic illustration of a section through a third exemplary embodiment.

In a third exemplary embodiment in accordance with FIG. 6, the brightness setting layer, instead of being partly insulating with a current blocking region and a current passage region, is realized with the aid of a continuous electrically conductive layer 19 which is arranged between connection region 4 and active layer 2 and whose electrical resistance is set depending on the desired brightness of the semiconductor layer sequence 3. In this case, partly insulating regions of a brightness setting layer may also be regarded as regions of the above brightness setting layer having an increased electrical resistance in comparison with other regions of the above brightness setting layer.

In yet another exemplary embodiment, in addition or as an alternative to the abovementioned brightness setting means for brightness setting, connecting webs 45 between the connection region 4 and the current injection region 5 are widened.

In a method according to an aspect of the invention, after the production or during the production of the semiconductor layer sequence 3 with an active layer 2 on a substrate, the brightness of the semiconductor layer sequence 3 is measured. Afterwards, on the basis of the measurement result, a suitable thickness and/or geometry of the absorbent brightness setting layer 12 and/or partly insulating brightness setting layer 6 is determined and the brightness setting layer(s) is/are formed correspondingly on the semiconductor layer sequence 3. This is followed by the formation of the contact layer 7. Connection region 4 and current injection region 5 are preferably electrically connected to each other via connecting webs 45. For this purpose, after the measurement of the semiconductor layer sequence 3 and the formation of an electrically insulating layer as a current blocking region 62 with a cut-out for the current passage region 61, the contact layer 7 is applied and the cut-out is at least partly filled with contact layer material in the process. As an alternative, after the measurement of the semiconductor layer sequence, the current passage region 61 and the current blocking region 62 may be produced by different dopings of a region of the semiconductor layer sequence 3 near the surface and the contact layer 7 may subsequently be applied.

It goes without saying that the invention is not restricted to the exemplary embodiments described in concrete terms, but rather extends to all apparatuses and methods which have the basic features of the invention. In particular, it is possible to use radiation-emitting semiconductor chips of different geometry and different construction. Moreover, the semiconductor layer sequences 3 may be constructed from different material systems, such as, for example, GaN-based or GaAs-based semiconductor material.

The scope of protection of the invention is not limited to the examples given herein above. The invention is embodied in each novel characteristic and each combination of characteristics, which particularly includes every combination of any features which are stated in the claims, even if this feature or this combination of features is not explicitly stated in the claims or in the examples.

We claim:

1. A radiation-emitting semiconductor chip, comprising:
   a semiconductor layer sequence having at least one active layer that generates electromagnetic radiation;
   a single continuous electrical contact layer arranged on the at least one active layer, said single continuous electrical contact layer comprising a connection region and a current injection region which is arranged at a distance beside the connection region and electrically connected thereto; and
   an absorbent brightness setting layer between the connection region and the current injection region and/or, as seen from the connection region, outside the current injection region on a front-side radiation coupling-out area of the semiconductor layer sequence, said brightness setting layer absorbing in a targeted manner part of the radiation generated in the semiconductor layer sequence;
   wherein the absorbent brightness setting layer includes a metal or an alloy comprised of at least two metals, and wherein the absorbent brightness setting layer extends beyond the connection region of the single continuous electrical contact layer in a lateral direction.

2. The semiconductor chip according to claim 1, wherein the absorbent brightness setting layer includes titanium.

3. The semiconductor chip according to claim 1, wherein the absorbent brightness setting layer includes platinum.

4. The semiconductor chip according to claim 1, wherein the absorbent brightness setting layer includes at least one material selected from the group comprising Au, AuGe, AuZn, AuBe and TiW(N).

5. The semiconductor chip according to claim 1, wherein the thickness of the absorbent brightness setting layer is between 2 nm and 30 nm, and is selected such that the radiation is absorbed by the absorbent brightness setting layer in a proportion such that a brightness of the semiconductor chip is within a predetermined range.

6. The semiconductor chip according to claim 1, wherein the thickness of the absorbent brightness setting layer is between 2 nm and 10 nm, and is selected such that the radiation is absorbed by the absorbent brightness setting layer in a proportion such that a brightness of the semiconductor chip is within a predetermined range.

7. The semiconductor chip according to claim 2, wherein the thickness of the absorbent brightness setting layer is between 2 nm and 10 nm, and is selected such that the radiation is absorbed by the absorbent brightness setting layer in a proportion such that a brightness of the semiconductor chip is within a predetermined range.

8. The semiconductor chip according to claim 3, wherein the thickness of the absorbent brightness setting layer is between 2 nm and 10 nm, and is selected such that the radiation is absorbed by the absorbent brightness setting layer in a proportion such that a brightness of the semiconductor chip is within a predetermined range.

9. The semiconductor chip according to claim 1, wherein a partly insulating brightness setting layer is arranged between the connection region and the active layer, the brightness setting layer comprising at least one electrically insulating current blocking region and at least one electrically conductive current passage region via which the connection region is electrically conductively connected to the semiconductor layer sequence such that, during operation of the semiconductor chip, part of the electromagnetic radiation generated in the chip is generated below the connection region and is absorbed by the connection region.

10. The semiconductor chip according to claim 1, wherein the semiconductor layer sequence is based on InGaAlP.

11. The semiconductor chip according to claim 1, wherein an electrically insulating layer is arranged at least partly between the current injection region and the semiconductor layer sequence.

12. The semiconductor chip according to claim 1, wherein a passivation layer is applied on the absorbent brightness setting layer.

13. The semiconductor chip according to claim 12, wherein the passivation layer is a silicon nitride layer.

14. A radiation-emitting semiconductor chip, comprising:
   a semiconductor layer sequence having at least one active layer that generates electromagnetic radiation,
   a single continuous electrical contact layer arranged on the at least one active layer, said single continuous electrical contact layer comprising a connection region and a current injection region which is arranged at a distance beside the connection region and electrically connected thereto; and a partly insulating brightness setting layer disposed between said connection region and said active layer, said brightness setting layer comprising at least one electrically insulating current blocking region and at least one electrically conductive current passage region via which the connection region is electrically conductively connected to the semiconductor layer sequence such that, during operation of the semiconductor chip, part of the electromagnetic radiation generated in the chip is generated below the connection region and is absorbed by the connection region.

15. The semiconductor chip according to claim 14, wherein an absorbent brightness setting layer is applied between the connection region and the current injection region and/or, as seen from the connection region, outside the current injection region on a front-side radiation coupling-out area of the semiconductor layer sequence, the brightness setting layer absorbing in a targeted manner part of the radiation generated in the semiconductor layer sequence.

16. The semiconductor chip according to claim 14, wherein a size and position of the current passage region are selected such that a proportion of an operating current of the semiconductor chip is injected below the connection region, and consequently leads to a corresponding absorption of radiation generated in the semiconductor chip in the connection region, and a radiation emission of the semiconductor chip is within a predetermined range.

17. The semiconductor chip according to claim 14, wherein the current blocking region contains silicon nitride.

18. The semiconductor chip according to claim 14, wherein the current blocking region comprises an electrically insulating layer with a cut-out applied on the semiconductor layer sequence, and the connection region is applied within the cut-out on the semiconductor layer sequence.

19. The semiconductor chip according to claim 14, wherein the current blocking region is an electrically insulating zone of the semiconductor layer sequence which is arranged between the active layer and the connection region.

20. The semiconductor chip according to claim 19, wherein the current blocking region is a proton-implanted zone of the semiconductor layer sequence.

21. The semiconductor chip according to claim 20, wherein the current passage region is a zone of the semiconductor layer sequence having a lower proton concentration than in the current blocking region.

22. The semiconductor chip according to claim 14, wherein a transverse conductivity in the semiconductor layer sequence is at a low level such that, during operation of the semiconductor chip, current which is injected into the semiconductor layer sequence below the connection region essentially remains limited to a region below the connection region.

23. The semiconductor chip according to claim 14, wherein the semiconductor layer sequence is based on InGaAlP.

24. The semiconductor chip according to claim 14, wherein an electrically insulating layer is arranged at least partly between the current injection region and the semiconductor layer sequence.

25. The semiconductor chip according to claim 9, wherein the electrically conductive current passage region and the connection region overlap in plan view.

26. The semiconductor chip according to claim 14, wherein the electrically conductive current passage region and the connection region overlap in plan view.

27. The semiconductor chip according claim 1, wherein the connection region and the current injection region are connected to each other via connecting webs.

28. The semiconductor chip according to claim 14, wherein the connection region and the current injection region are connected to each other via connecting webs.

* * * * *